images/US009685341B2

United States Patent
Mori et al.

(10) Patent No.: US 9,685,341 B2
(45) Date of Patent: Jun. 20, 2017

(54) ABRASIVE COMPOSITION AND METHOD FOR PRODUCING SEMICONDUCTOR SUBSTRATE

(71) Applicant: FUJIMI INCORPORATED, Kiyosu-shi, Aichi (JP)

(72) Inventors: Yoshio Mori, Kiyosu (JP); Kohsuke Tsuchiya, Kiyosu (JP); Maki Asada, Kiyosu (JP); Shuhei Takahashi, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/382,876

(22) PCT Filed: Mar. 12, 2013

(86) PCT No.: PCT/JP2013/056702
§ 371 (c)(1),
(2) Date: Sep. 4, 2014

(87) PCT Pub. No.: WO2013/137212
PCT Pub. Date: Sep. 19, 2013

(65) Prior Publication Data
US 2015/0079789 A1    Mar. 19, 2015

(30) Foreign Application Priority Data

Mar. 14, 2012  (JP) ................. 2012-057641

(51) Int. Cl.
| | |
|---|---|
| *H01L 21/306* | (2006.01) |
| *H01L 21/321* | (2006.01) |
| *C09K 3/14* | (2006.01) |
| *B24B 1/00* | (2006.01) |
| *C09G 1/00* | (2006.01) |
| *C09G 1/04* | (2006.01) |
| *C09G 1/06* | (2006.01) |
| *B24B 37/04* | (2012.01) |
| *H01L 21/02* | (2006.01) |
| *C09G 1/02* | (2006.01) |

(52) U.S. Cl.
CPC .......... *H01L 21/30625* (2013.01); *B24B 1/00* (2013.01); *B24B 37/044* (2013.01); *C09G 1/00* (2013.01); *C09G 1/02* (2013.01); *C09G 1/04* (2013.01); *C09G 1/06* (2013.01); *C09K 3/1436* (2013.01); *C09K 3/1454* (2013.01); *C09K 3/1463* (2013.01); *H01L 21/02024* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 2005/0054203 A1 | 3/2005 | Yamada | |
| 2006/0135045 A1* | 6/2006 | Bian | ........... C09G 1/02 451/36 |
| 2007/0181851 A1 | 8/2007 | Yamada | |
| 2011/0053462 A1* | 3/2011 | Shida | ........... C09G 1/02 451/36 |

FOREIGN PATENT DOCUMENTS

| | | | |
|---|---|---|---|
| JP | 2005-085858 A | 3/2005 | |
| JP | 2007-214205 A | 8/2007 | |
| JP | 2009-147267 | * 12/2007 | ........... H01L 21/304 |
| JP | 2009-147267 A | 7/2009 | |
| JP | 2011-097050 A | 5/2011 | |

* cited by examiner

Primary Examiner — Jiong-Ping Lu
(74) Attorney, Agent, or Firm — Foley & Lardner LLP

(57) ABSTRACT

The polishing composition has a pH of 7 or more and is used in applications for polishing a silicon substrate. The polishing composition contains abrasive grains and a water-soluble polymer. The water-soluble polymer is a copolymer including a first monomer unit having a characteristic value P of 50-100 inclusive, and a second monomer unit having a characteristic value P of at least −100 and less than 50. The characteristic value P is the result of subtracting an adsorption coefficient S2 of the abrasive grains obtained through a specific standard test B from a wettability coefficient S1 of the silicon substrate obtained through a specific standard test A.

6 Claims, No Drawings

ABRASIVE COMPOSITION AND METHOD FOR PRODUCING SEMICONDUCTOR SUBSTRATE

TECHNICAL FIELD

The present invention relates to a polishing composition and a method for producing a semiconductor substrate.

BACKGROUND ART

As a polishing composition used in application for polishing a surface of a silicon substrate, polishing compositions containing water-soluble polymers have been known. Some water-soluble polymers have a function to reduce the haze level of a polished surface of a silicon substrate through stabilization of dispersion state of abrasive grains via adsorption onto abrasive grains, while some others have a function to be adsorbed onto a polished surface of a silicon substrate to improve the wettability of the polished surface.

In Patent Document 1, it is disclosed that a polishing composition containing a polyvinyl alcohol (PVA)-polyvinyl pyrrolidone (PVP) copolymer in which vinyl pyrrolidone (VP) has been graft-polymerized onto PVA is used in application for polishing a metal film formed on a substrate. According to the polishing composition of Patent Document 1, a high polishing rate can be attained, while maintaining a low etching rate upon the polishing of the metal film. In Patent Document 1, however, there is no disclosure of use of the polishing composition containing the PVA-PVP copolymer for polishing the silicon substrate.

PRIOR ART DOCUMENTS

Patent Document

Patent Document 1: Japanese Laid-Open Patent Publication No. 2009-147267

SUMMARY OF THE INVENTION

Problems that the Invention is to Solve

As stated above, the polishing compositions used in application for polishing silicon substrates contain a variety of water-soluble polymers for the purpose of reducing the haze level of a polished surface of a silicon substrate and improving the wettability of the polished surface. The water-soluble polymers contained in the conventional polishing compositions used for polishing silicon substrates, however, have not been capable of simultaneously achieving the reduction of the haze level of a polished surface of a silicon substrate and improvement of the wettability of the polished surface.

The present inventors have found that the wettability of a polished surface of a silicon substrate can be improved, while the haze level of the polished surface being reduced when a copolymer composed of a first monomer unit having an excellent wettability imparting characteristic to the silicon substrate and a second monomer unit having an excellent adsorption characteristic to the abrasive grains is employed as a water-soluble polymer.

The present invention has been accomplished on the basis of the findings described above and is intended to provide a polishing composition and a method for producing a semiconductor substrate capable of improving wettability of a polished surface of a silicon substrate, as well as reducing the haze level of the polished surface.

Means for Solving the Problems

To achieve the foregoing objective and in accordance with one aspect of the present invention, a polishing composition having a pH of 7 or more used in an application to polish a silicon substrate is provided. The polishing composition contains abrasive grains and a water-soluble polymer. The water-soluble polymer is a copolymer composed of a first monomer unit having a characteristic value P of 50 or more and 100 or less and a second monomer unit having a characteristic value P of −100 or more and less than 50. The characteristic value P is a difference obtained by subtracting an adsorption coefficient S2 for the abrasive grains from a wettability coefficient S1 for the silicon substrate. The wettability coefficient S1 and the adsorption coefficient S2 are obtained through standard test A and B described below, respectively.

[Standard Test A]

(a1) A homopolymer consisting of only a monomer unit to be tested having an average degree of polymerization of 800 or more and 1200 or less is provided as a test polymer.

(a2) A square silicon chip (side length of 32 mm, conduction type of P type, crystal orientation of <100>, and resistivity of 0.1 Ω·cm or more and 100 Ω·cm or less) is immersed in a hydrofluoric acid solution so that an oxide film on a silicon chip surface is removed.

(a3) The silicon chip, in a vertically upright state, is immersed in a 0.02% aqueous solution of the test polymer for 30 seconds.

(a4) The silicon chip is removed from the aqueous solution of the test polymer, and then the silicon chip is arranged such that one diagonal line thereof is oriented in the vertical direction. After 5-second standing, the shortest distance X [mm] from the highest point of the silicon chip to the liquid surface remaining on the silicon chip surface is measured.

(a5) The wettability coefficient S1 of the monomer unit composing the test polymer is calculated from the measured shortest distance X based on the expression below.

Wettability coefficient $S1=\{$(the length of the diagonal line of the silicon chip [mm])−(the shortest distance $X$ [mm])$\}/$(the length of the diagonal line of the silicon chip [mm])×100

[Standard Test B]

(b1) A homopolymer consisting of only a monomer unit to be tested having an average degree of polymerization of 800 or more and 1200 or less is provided as a test polymer.

(b2) An aqueous solution containing 10% by mass of colloidal silica having an average primary particle size of 35 nm, 0.2% by mass of ammonia, and 0.02% by mass of the test polymer is prepared. The aqueous solution is allowed to stand for 12 hours so that the test polymer is adsorbed onto the colloidal silica.

(b3) Water is added to the aqueous solution to dilute the solution in a predetermined dilution rate in terms of volume. The diluted aqueous solution is centrifuged to precipitate the colloidal silica and the test polymer adsorbed onto the colloidal silica.

(b4) The concentration Y [% by mass] of the test polymer in a supernatant liquid of the aqueous solution after centrifugation treatment is measured.

(b5) The adsorption coefficient S2 of the monomer unit composing the test polymer is calculated from the measured concentration Y of the test polymer based on the expression below.

Adsorption coefficient $S2=\{0.02-$(the concentration $Y$)×(the dilution rate)$\}/0.02×100$ The copolymer is preferably a block copolymer or a graft copolymer.

At least one monomer unit composing the copolymer is preferably a monomer unit derived from an ethylenically unsaturated compound.

The first monomer unit preferably has at least one structure selected from an ethylene oxide group, a carboxy group, a sulfo group, an amino group, a hydroxyl group, an amide group, an imide group, a nitrile group, an ether group, an ester group, and salts thereof.

The second monomer unit preferably has a heterocyclic ring, and the heterocyclic ring is preferably a lactam group.

In accordance with another aspect of the present invention, a method for producing a semiconductor substrate is provided that includes a polishing step of polishing a silicon substrate using the above described polishing composition.

Effects of the Invention

According to the polishing composition of the present invention, the wettability of a polished surface of a silicon substrate can be improved and also the haze level of the polished surface can be reduced. In addition, according to the method for producing a semiconductor substrate using the polishing composition of the present invention, polished products with stable quality can be produced.

MODES FOR CARRYING OUT THE INVENTION

An embodiment of the present invention will now be described.

A polishing composition contains abrasive grains and a water-soluble polymer, and preferably, further contains a basic compound, a chelating agent, and a surfactant. The polishing composition is prepared by mixing each of the ingredients such as abrasive grains and the water-soluble polymer in water.

The polishing composition has a pH of 7 or more and is used in application for polishing a surface of a silicon substrate. A silicon substrate polishing step includes a preliminary polishing step (primary polishing and secondary polishing) of flattening the surface of a disk-like silicon substrate sliced from a silicon single crystal ingot and a final polishing step of further removing minute unevenness existing on the surface of the silicon substrate after the preliminary polishing step to perform mirror-finishing. The polishing composition can be suitably used in application for the preliminary polishing and also application for the final polishing. The silicon substrate, of which surface has been polished with the polishing composition, can be suitably used for manufacturing a semiconductor substrate.

Abrasive Grains

The abrasive grains serve a function to physically polish the surface the silicon substrate.

Examples of the abrasive grains include inorganic particles, organic particles, and organic-inorganic composite particles. Specific examples of the inorganic particles include particles consisting of metal oxides such as silica, alumina, ceria, and titania; and a silicon nitride particle, a silicon carbide particle and a boron nitride particle. Specific examples of the organic particles include a polymethyl methacrylate (PMMA) particle.

Among these specific examples, silica is preferred. Specific examples of silica include colloidal silica, fumed silica, and sol-gel silica. Colloidal silica and fumed silica are preferred from the viewpoint of reducing scratches generated on the polished surface of the silicon substrate and colloidal silica is particularly preferred. One of such silica may be used alone or two or more thereof may be used in combination.

The true specific gravity of the silica is preferably 1.5 or more, more preferably 1.6 or more, and further preferably 1.7 or more. The larger the true specific gravity of the silica, the higher the polishing rate that can be attained upon polishing the silicon substrate. The true specific gravity of the silica is preferably 2.2 or less. The lower the true specific gravity of the silica, the fewer the scratches generated on the polished surface of the silicon substrate. The true specific gravity of the silica is calculated from the weight of the dried silica particles and the total weight after immersing the silica particles in ethanol of a known volume.

The average primary particle size of the abrasive grains is preferably 5 nm or more, more preferably 10 nm or more, and further preferably 20 nm or more. The larger the average primary particle size of the abrasive grains, the higher the polishing rate that can be attained upon polishing of the silicon substrate. The average primary particle size of the abrasive grains is preferably 100 nm or less, more preferably 50 nm or less, and further preferably 40 nm or less. The smaller the average primary particle size of the abrasive grains, the more stabled the polishing composition becomes.

The value of the average primary particle size of the abrasive grains is calculated, for example, based on a specific surface area thereof measured by the BET method. The specific surface area of the abrasive grains can be measured using, for example, Flow Sorb II 2300 produced by Micromeritics Instrument Corporation.

The average secondary particle size of the abrasive grains is preferably 10 nm or more, and more preferably 20 nm or more. The larger the average secondary particle size of the abrasive grains, the higher the polishing rate that can be attained upon polishing of the silicon substrate. The average secondary particle size of the abrasive grains is preferably 200 nm or less, and more preferably 150 nm or less. The smaller the average secondary particle size of the abrasive grains, the more stabilized the polishing composition becomes. The average secondary particle size of the abrasive grains can be measured by, for example, the dynamic light scattering method using FPAR-1000 produced by Otsuka Electronics Co., Ltd.

The average value of major axis/minor axis ratios of the abrasive grains is preferably 1.0 or more, more preferably 1.05 or more, and further preferably 1.1 or more. The larger the average value of the major axis/minor axis ratios, the higher the polishing rate that can be attained upon polishing of the silicon substrate. The average value of the major axis/minor axis ratios of the abrasive grains is preferably 3.0 or less, more preferably 2.0 or less, and further preferably 1.5 or less. The smaller the average value of the major axis/minor axis ratios, the fewer the scratches generated on the polished surface of the silicon substrate.

The ratio of the number of particles having major axis/minor axis ratios of 1.5 or more to the total number of the abrasive grains contained in the polishing composition is preferably 10% or more, and more preferably 20% or more. The larger the ratio of the particles having major axis/minor axis ratios of 1.5 or more, the higher the polishing rate that can be attained upon polishing of the silicon substrate. The ratio of the particles having major axis/minor axis ratios of 1.5 or more is preferably 90% or less, and more preferably 80% or less. The smaller the ratio of the particles having major axis/minor axis ratios of 1.5 or more, the less the haze level of the polished surface of the silicon substrate.

The major axis/minor axis ratio is a value relating to the shape of the abrasive grains and can be obtained, for example, using an electron microscope image of the abrasive grains. Specifically, the minimum bounding rectangle is drawn for each abrasive grain on the scanning electron microscope images of a predetermined number of (e.g., 200) abrasive grains. Subsequently, for each minimum bounding rectangle the length of the long side (major axis value) is divided by the length of the short side (minor axis value) to calculate the major axis/minor axis ratio. Then, the average value of the major axis/minor axis ratios can be obtained by calculating the average value of the obtained ratios.

The abrasive grain content in the polishing composition is preferably 0.1% by mass or more, and more preferably 0.15% by mass or more. The larger the abrasive grain content, the higher the polishing rate that can be attained upon polishing of the silicon substrate. The abrasive grain content in the polishing composition is preferably 10% by mass or less, more preferably 8% by mass or less, further preferably 6% by mass or less, still more preferably 3% by mass or less, and most preferably 1% by mass or less. The smaller the abrasive grain content, the more stable the polishing composition becomes.

Water-soluble Polymer

The polishing composition contains a particular copolymer as a water-soluble polymer. The copolymer improves wettability of the polished surface and also reduces the haze level of the polished surface upon the surface treatment of the silicon substrate such as polishing or rinse treatment.

The copolymer includes as monomer units (constitutional units) a first monomer unit having an excellent wettability imparting characteristic to the silicon substrate and a second monomer unit having an excellent adsorption characteristic to the abrasive grains. Specifically, the copolymer is composed of a first monomer unit having a characteristic value P of 50 or more and 100 or less and a second monomer unit having a characteristic value P of −100 or more and less than 50. The characteristic value P is a difference obtained by subtracting an adsorption coefficient S2 for the abrasive grains from a wettability coefficient S1 for the silicon substrate.

The wettablity coefficient S1 refers to an index value indicating the magnitude of the wettability imparting characteristic of the monomer unit to the silicon substrate, which is a value obtained through the standard test A described below. The adsorption coefficient S2 refers to an index value indicating the magnitude of the adsorption characteristic of the monomer unit to the abrasive grains, which is a value obtained through the standard test B described below.

[Standard Test A]

(a1) A homopolymer consisting of only a monomer unit to be tested having an average degree of polymerization of 800 or more and 1200 or less is provided as a test polymer.

(a2) A square silicon chip (side length of 32 mm, conduction type of P type, crystal orientation of <100>, and resistivity of 0.1 Ω·cm or more and 100 Ω·cm or less) is immersed in a hydrofluoric acid solution so that an oxide film on the silicon chip surface is removed.

(a3) The silicon chip, in a vertically upright state, is immersed in a 0.02% aqueous solution of the test polymer for 30 seconds.

(a4) The silicon chip is removed from the aqueous solution of the test polymer, and then the silicon chip is arranged such that one diagonal line is oriented in the vertical direction. After 5-second standing, the shortest distance X [mm] from the highest point (upper apex) of the silicon chip to the liquid surface remaining on the silicon chip surface is measured.

(a5) The wettability coefficient S1 of the monomer unit composing the test polymer is calculated from the measured shortest distance X based on the expression describe below:

Wettability coefficient $S1=\{$(the length of the diagonal line of the silicon chip [mm])−(the shortest distance $X$ [mm])$\}$/(the length of the diagonal line of the silicon chip [mm])×100

[Standard Test B]

(b1) A homopolymer consisting of only a monomer unit to be tested having an average degree of polymerization of 800 or more and 1200 or less is provided as a test polymer.

(b2) An aqueous solution containing 10% by mass of colloidal silica having an average primary particle size of 35 nm, 0.2% by mass of ammonia, and 0.02% by mass of the test polymer is prepared. The aqueous solution is allowed to stand for 12 hours so that the test polymer is adsorbed onto the colloidal silica.

(b3) Water is added to the aqueous solution to dilute the solution in a predetermined dilution rate in terms of volume. The diluted aqueous solution is centrifuged to precipitate the colloidal silica and the test polymer adsorbed onto the colloidal silica.

(b4) The concentration Y [mass %] of the test polymer in the supernatant liquid of the aqueous solution after centrifugation treatment is measured. The concentration Y of the test polymer can be obtained, for example, based on the total organic carbon (TOC) content of the supernatant liquid.

(b5) The adsorption coefficient S2 of the monomer unit composing the test polymer is calculated from the measured concentration Y of the test polymer based on the expression described below:

Adsorption coefficient $S2=\{0.02-$(concentration $Y$)×(dilution rate)$\}$/0.02×100

Details of the first monomer unit and the second monomer unit composing the above described copolymer will be described.

The first monomer unit has a characteristic value P, which is the difference obtained by subtracting the adsorption coefficient S2 from the wettability coefficient S1 (P=S1−S2), of 50 or more and 100 or less. The wettability coefficient S1 of the first monomer unit is preferably 50 or more, more preferably 70 or more, further preferably 80 or more, and most preferably 90 or more.

The first monomer unit is preferably a monomer unit having at least one structure selected from an ethylene oxide group, a carboxy group, a sulfo group, an amino group, a hydroxyl group, an amide group, an imide group, a nitrile group, an ether group, an ester group, and salts thereof, and particularly preferably a monomer unit derived from an ethylenically unsaturated compound such as vinyl alcohol or acrylic acid. Among them, a monomer unit derived from vinyl alcohol is particularly preferred.

The first monomer unit may consist of only one type of monomer unit or two or more types of monomer units. When the first monomer unit consists of two or more types of monomer units, at least one type of the monomer units is preferably a monomer unit derived from the ethylenically unsaturated compound, and more preferably all of the first monomer units are monomer units derived from the ethylenically unsaturated compounds.

The second monomer unit has a characteristic value P, which is the difference obtained by subtracting the adsorption coefficient S2 from the wettability coefficient S1

(P=S1−S2), of −100 or more and less than 50. The adsorption coefficient S2 of the second monomer unit is preferably 50 or more, more preferably 70 or more, further preferably 80 or more, and most preferably 90 or more.

The second monomer unit is preferably a monomer unit having a heterocyclic ring such as a lactam group, and particularly preferably a monomer unit derived from an ethylenically unsaturated compound such as N-vinyl-2-pyrrolidone or N-vinyl-ε-caprolactam. Among them, a monomer unit derived from N-vinyl-2-pyrrolidone is particularly preferred.

The second monomer unit may consist of only one type of monomer unit or two or more types of monomer units. When the second monomer unit consists of two or more types of monomer units, at least one type of the monomer units is preferably a monomer unit derived from the ethylenically unsaturated compound, and more preferably all of the second monomer units are monomer units derived from the ethylenically unsaturated compounds.

Specific examples of the above described copolymer include PVA-PVP copolymer consisting of the first monomer unit derived from vinyl alcohol and the second monomer unit derived from N-vinyl-2-pyrrolidone.

The above copolymer may be any of a random copolymer, an alternating copolymer, a block copolymer, and a graft copolymer composed of the first monomer unit and second monomer unit. Among them, the copolymer is preferably a block copolymer or a graft copolymer having a first polymer composed of the first monomer unit as a main component and a second polymer composed of the second monomer unit as a main component because the wettability imparting characteristic of the first monomer unit to the silicon substrate and adsorption characteristic of the second monomer unit to the abrasive grains are more significantly exhibited.

Specifically, when the copolymer is a block copolymer, the copolymer is preferably a block copolymer consisting of the first polymer (first block chain) composed of the first monomer unit as a main component and the second polymer (second block chain) composed of the second monomer unit as a main component.

When the copolymer is a graft copolymer, the copolymer is preferably a graft copolymer in which the first polymer (main chain) composed of the first monomer unit as a main component is grafted with a second polymer (side chain) composed of the second monomer unit as a main component or that in which the second polymer (main chain) mainly composed of the second monomer unit is grafted with the first polymer (side chain) mainly composed of the first monomer unit.

The proportion of the first monomer unit in the first polymer is preferably 50% or more, more preferably 70% or more, further preferably 90% or more, and most preferably 100%. As the first polymer, a polymer composed of the first monomer unit derived from vinyl alcohol as a main component is preferred, and PVA polymer is more preferred.

The proportion of the second monomer unit in the second polymer is preferably 50% or more, more preferably 70% or more, further preferably 90% or more, and most preferably 100%. As the second polymer, a polymer composed of the second monomer unit derived from N-vinyl-2-pyrrolidone as a main component is preferred, and PVP polymer is more preferred.

Accordingly, as the block copolymer the PVA-PVP block copolymer in which the first block chain is PVA polymer and the second block chain is PVP polymer is particularly preferred. As the graft copolymer the PVA-PVP graft copolymer in which the main chain is PVA polymer and the side chain is PVP polymer or the PVP-PVA graft copolymer in which the main chain is PVP polymer and the side chain is PVA polymer is particularly preferred, and the PVA-PVP graft copolymer in which the main chain is PVA polymer and the side chain is PVP polymer is the most preferred.

The weight average molecular weight of the whole copolymer is preferably 2000 or more in terms of polyethylene oxide, more preferably 10000 or more, and further preferably 15000 or more. The larger the weight average molecular weight of the whole copolymer, the more improved the wettability of the polished surface of the silicon substrate becomes. The weight average molecular weight of the whole copolymer is preferably 2000000 or less, more preferably 1500000 or less, further preferably 1000000 or less, and most preferably 500000 or less. The smaller the weight average molecular weight of the whole copolymer, the more stabled the polishing composition becomes.

When the copolymer is a block copolymer, the weight average molecular weight of each block chain consisting of the first monomer unit or second monomer unit is preferably 1000 or more in terms of polyethylene oxide, more preferably 10000 or more, further preferably 15000 or more, and most preferably 20000 or more. The weight average molecular weight of each block chain is preferably 1000000 or less, more preferably 500000 or less, and most preferably 300000 or less.

When the copolymer is a graft copolymer, the weight average molecular weight of the main chain consisting of one of the first monomer unit and the second monomer unit is preferably 1000 or more in terms of polyethylene oxide, more preferably 5000 or more, further preferably 10000 or more, and still more preferably 15000 or more. The weight average molecular weight of the main chain is preferably 1000000 or less, more preferably 500000 or less, further preferably 300000 or less, still more preferably 200000 or less, and most preferably 100000 or less.

The weight average molecular weight of the side chain consisting of the other of the first monomer unit and second monomer unit is preferably 1000 or more in terms of polyethylene oxide, more preferably 10000 or more, and further preferably 15000 or more. The weight average molecular weight of the side chain is preferably 1000000 or less, more preferably 500000 or less, further preferably 300000 or less, still more preferably 200000 or less, and most preferably 100000 or less.

The content of the copolymer in the polishing composition is preferably 0.002% by mass or more, and more preferably 0.004% by mass or more. The higher the content of the copolymer is, the less the haze level of the polished surface of the silicon substrate becomes and also the more improved the wettability of the polished surface thereof becomes. The content of the copolymer in the polishing composition is preferably 0.5% by mass or less, more preferably 0.05% by mass or less, further preferably 0.03% by mass or less, and most preferably 0.02% by mass or less. The lower the content of the copolymer, the more stabled the polishing composition becomes.

Water

Water is a dispersion medium or solvent for other ingredients. The water preferably does not inhibit functions of other ingredients contained in the polishing composition. Examples of such water include water having a total content of transition metal ions of 100 ppb or less. The purity of the water can be improved by, for example, removal of impurity ions with an ion exchange resin, removal of foreign matters with a filter, or distillation. Specifically, it is preferred to use, for example, deionized water, pure water, super-pure water, or distilled water.

pH

A pH of the polishing composition is 7.0 or more, preferably 8.0 or more, further preferably 9.0 or more, and most preferably 10.0 or more. The higher the pH of the polishing composition, the higher the polishing rate that can be attained upon polishing of the silicon substrate. The pH of the polishing composition is preferably 12.0 or less, more preferably 11.0 or less, and most preferably 10.5 or less. The lower the pH of the polishing composition, the easier it is to retain the shape of the silicon substrate.

Basic Compound

The polishing composition may contain a basic compound. The basic compound serves a function to chemically polish (chemical etching) the polished surface of the silicon substrate. This allows the polishing rate to be improved easily upon polishing of the silicon substrate.

Specific examples of the basic compounds include hydroxides or salts of alkali metals, quaternary ammonium hydroxides or salts thereof, ammonia, and amines. Examples of the alkali metals include potassium and sodium. Examples of the salts include carbonates, bicarbonates, sulfates, and acetates. Examples of the quaternary ammoniums include tetramethylammonium, tetraethylammonium, and tetrabutylammonium. Specific examples of the hydroxides or salts of alkali metals include potassium hydroxide, potassium carbonate, potassium bicarbonate, potassium sulfate, potassium acetate, and potassium chloride. Specific examples of the quaternary ammonium hydroxides or salts thereof include tetramethylammonium hydroxide, tetraethylammonium hydroxide, and tetrabutylammonium hydroxide. Specific examples of the amines include methylamine, dimethylamine, trimethylamine, ethylamine, diethylamine, triethylamine, ethylenediamine, monoethanolamine, N-(β-aminoethyl) ethanolamine, hexamethylenediamine, diethylenetriamine, triethylenetetramine, anhydrous piperazine, piperazine hexahydrate, 1-(2-aminoethyl)piperazine, N-methyl piperazine, and guanidine. One of such basic compounds may be used alone or two or more thereof may be used in combination.

Among the basic compounds, at least one selected from ammonia, ammonium salts, alkali metal hydroxides, alkali metal salts, and quaternary ammonium hydroxides is preferred. Among the basic compounds, at least one selected from ammonia, potassium hydroxide, sodium hydroxide, tetramethylammonium hydroxide, tetraethylammonium hydroxide, ammonium bicarbonate, ammonium carbonate, potassium bicarbonate, potassium carbonate, sodium bicarbonate, and sodium carbonate is more preferred. Among the basic compounds, at least one selected from ammonia, potassium hydroxide, sodium hydroxide, tetramethylammonium hydroxide, and tetraethylammonium hydroxide is further preferred, at least one of ammonia and tetramethylammonium hydroxide is still more preferred, and ammonia is the most preferred.

The content of the basic compound in the polishing composition is 0.001% by mass or more, preferably 0.002% by mass or more, and further preferably 0.003% by mass or more. The higher the content of the basic compound, the higher the polishing rate that can be attained upon polishing of the silicon substrate. The content of the basic compound in the polishing composition is preferably 1.0% by mass or less, more preferably 0.5% by mass or less, further preferably 0.2% by mass or less, and most preferably 0.1% by mass or less. The lower the content of the basic compound, the easier it is to retain the shape of the silicon substrate.

Chelating Agent

The polishing composition may contain a chelating agent. The chelating agent serves a function to scavenge metallic impurities in the polishing system to form complexes, thereby suppressing metal contamination of the silicon substrate.

Specific examples of the chelating agents include aminocarboxylic acid-based chelating agents, and organic phosphonic acid-based chelating agents. Specific examples of the aminocarboxylic acid-based chelating agents include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetraminehexaacetic acid, and sodium triethylenetetraminehexaacetate. Specific examples of the organic phosphonic acid-based chelating agents include 2-aminoethylphosphonic acid, 1-hydroxyethylidene-1,1-diphosphonic acid, aminotri(methylenephosphonic acid), ethylenediaminetetrakis(methylenephosphonic acid), diethylentriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxylic-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid.

Surfactant

The polishing composition may contain a surfactant. The surfactant serves a function to suppress roughening of the polished surface of the silicon substrate. This allows the haze level of the polished surface of the silicon substrate to be reduced easily. Particularly, when the polishing composition contains the basic compound, the polished surface of the silicon substrate tends to be roughened due to the chemical etching with the basic compound. Therefore, the use of the basic compound and the surfactant in combination is particularly effective.

The weight average molecular weight of the surfactant is preferably less than 10000. An anionic or nonionic surfactant can be used, and among them, the nonionic surfactant is particularly suitably used. The nonionic surfactant makes the polishing composition easy to be handled during preparation or use thereof due to low foaming of the nonionic surfactant. Also when the nonionic surfactant is used, the pH of the polishing composition is easily adjusted.

Specific examples of the nonionic surfactants include: oxyalkylene polymers such as polyethylene glycol and polypropylene glycol; polyoxyalkylene adducts and the like such as polyoxyethylene alkyl ethers, polyoxyethylene alkyl phenyl ethers, polyoxyethylene alkylamines, polyoxyethylene fatty acid esters, polyoxyethylene glyceryl ether fatty acid esters, polyoxyethylene sorbitan fatty acid esters; and copolymers of a plurality of oxyalkylenes (diblock-type, triblock-type, random-type, alternating-type).

Specific examples include polyoxyethylene-polyoxypropylene copolymer, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ethers, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene lauryl amine, polyoxyethylene stearyl amine, polyoxyethylene oleyl amine, polyoxyethylene stearyl amide, polyoxyethylene oleyl amide, polyoxyethylene monolaurate, polyoxyethylene monostearate, polyoxyethylene distearate, polyoxyethylene monooleate, polyoxyethylene dinooleate, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitan tetraoleate, polyoxyethylene sorbitol tetraoleate, polyoxyethylene castor oil, and polyoxyethylene hydrogenated castor oil. Among these surfactants, polyoxyethylene alkyl ethers, particularly polyoxyethylene decyl ether is suitably used.

One of the surfactants may be used alone or two or more thereof may be used in combination.

Other Ingredients

The polishing composition may further contain known additives commonly contained in polishing compositions, e.g. preservative and an antifungal agent, as necessary. Specific examples of the preservatives and antifungal agents include isothiazoline-based compounds, p-hydroxybenzoates, and phenoxyethanol.

The polishing composition, however, preferably does not contain an oxidizing agent such as hydrogen peroxide, nitric acid, potassium periodate, hypochlorous acid, or ozone water or coating forming agents such as alkyl amines, amino acids, imines, azoles, mercaptan, glucose, and cellulose since the polishing composition is used in application for polishing a surface of a silicon substrate.

In a polishing step of polishing the surface of the silicon substrate using the polishing composition, the silicon substrate and a polishing pad, which is pressed against the surface of the silicon substrate, are rotated while the polishing composition is being supplied to the surface of the silicon substrate. Then, the surface of the silicon substrate is polished by a physical function due to friction between the polishing pad and the surface of the silicon substrate and a physical function due to friction between the abrasive grains in the polishing composition and the surface of the silicon substrate. When the polishing composition contains the basic compound, the surface of the silicon substrate is also polished by a chemical function due to the basic compound in addition to the physical functions described above.

Operation of the polishing composition of the present embodiment will now be described.

As described above, the polishing composition contains the copolymer composed of the first monomer unit having a characteristic value P of 50 or more and 100 or less and second monomer unit having a characteristic value P of −100 or more and less than 50. Due to the coexistence of a monomer unit having a large characteristic value P (first monomer unit) and a monomer unit having a small characteristic value P (second monomer unit) in one molecule of the above described copolymer, the wettability imparting characteristic to the polished surface and the adsorption characteristic to the abrasive grains can be exhibited simultaneously. The present inventors have found that the use of the water-soluble polymer having these characteristics is a requirement for the simultaneous realization of the reduction of the haze level and the improvement of the wettability of the polished surface of the silicon substrate.

The copolymer is suitably adsorbed onto the abrasive grains via the portion consisting of the second monomer unit having an excellent adsorption characteristic to the abrasive grains, thereby improving the dispersion stability of the abrasive grains in the polishing composition. The improved dispersion stability reduces the haze level of the polished surface of the silicon substrate. Also the copolymer is suitably adsorbed onto the polished surface of the silicon substrate via the portion consisting of the first monomer unit having an excellent wettability imparting characteristic to the silicon substrate, thereby improving the wettability of the polished surface thereof.

In practice, the copolymer is first adsorbed onto the abrasive grains upon preparation of the polishing composition. The copolymer adsorbed onto the abrasive grains is then transferred (is adsorbed) to the polished surface of the silicon substrate through contact of the abrasive grains and the silicon substrate during the polishing, thereby imparting the wettability to the polished surface. In the present invention the characteristic value P of the first monomer unit is set to as high a range as 50 or more in order to be able to ensure exhibition of the wettability imparting characteristic of the copolymer.

According to the embodiment described above, the following advantages are exerted.

(1) Through the above described functions of the copolymer in the polishing composition, the haze level of the polished surface of the silicon substrate can be reduced, while the wettability of the polished surface is improved.

(2) The copolymer in the polishing composition is preferably a block copolymer or a graft copolymer having first polymer composed of a first monomer unit as a main component and a second polymer composed of a second monomer unit as a main component. In this case, the wettability imparting characteristic of the first monomer unit to the silicon substrate and the adsorption characteristic of the second monomer unit to the abrasive grains can be more significantly exhibited.

(3) The method for producing a semiconductor substrate includes the polishing step of polishing a silicon substrate using the polishing composition. Thereby, a silicon substrate of which polished surface has improved wettability and reduced haze level can be formed and a semiconductor substrate with high quality can be produced therefrom.

In addition, the embodiment described above may be modified as follows.

The polishing composition may further contain other water-soluble polymer in addition, to the above described copolymer.

The polishing composition may be one-component type or multi-component type including two-component type.

The polishing composition may be in a condensed state upon production and sales. That is, the polishing composition may be produced or sold in a form of undiluted solution of the polishing composition.

The polishing composition may be prepared by diluting the undiluted solution of the polishing composition with water. In this case the dilution rate is preferably twofold or more, more preferably fivefold or more, and further preferably tenfold or more. The larger the dilution rate, the lower the transportation cost for the undiluted solution of the polishing composition becomes and also the more the storage area therefor can be saved. The dilution rate is preferably hundredfold or less, more preferably fiftyfold or less, and further preferably fortyfold or less. The smaller the dilution rate, the more stabled the undiluted solution of the polishing composition becomes.

Each of the ingredients contained in the polishing composition may be filtered with a filter immediately before production. Also the polishing composition may be filtered with a filter immediately before use and then used. By filtering the polishing composition, coarse foreign matters in the polishing composition are removed, so that the quality is improved.

Materials and structure of the filter used for the filtering treatment are not particularly limited. Examples of the materials of the filter include cellulose, nylon, polysulfone, polyethersulfone, polypropylene, polytetrafluoroethylene (PTFE), polycarbonate, and glass. Examples of the structure of the filter include a depth filter, pleated filter, and membrane filter.

The polishing pad used in the polishing step using the polishing composition is not particularly limited. For example, any of those of nonwoven cloth type, suede type, and those containing abrasive grains and not containing abrasive grains may be used.

Upon polishing a silicon substrate using the polishing composition, the polishing composition once used for polishing may be recovered and reused for polishing a silicon substrate. Examples of the methods for reusing the polishing composition include a method in which the used polishing composition exhausted from the polishing apparatus is once recovered in a tank and then used by recycling the polishing composition into the polishing apparatus from inside of the tank. Reuse of the polishing composition can reduce the amount of discharge of the polishing composition as waste liquid, as well as the quantity consumed of the polishing composition. This is useful with respect to capability of reducing the environmental burden and suppressing the cost for polishing the silicon substrate.

During reuse of the polishing composition, the ingredients such as the abrasive grains are consumed by polishing and thus diminished. Therefore, it is preferred to replenish each of the ingredients such as the abrasive grains in the amount corresponding to the reduction thereof to the polishing composition. The ingredients to be replenished may be individually added to the polishing composition, or alternatively, added as a mixture containing two or more of the ingredients in any concentrations to the polishing composition depending on the tank capacity or polishing conditions. By replenishing each of the ingredients in the amount corresponding to the reduction thereof to the reused polishing composition, the composition of the polishing composition can be retained so that the polishing composition can sustainably exert functions thereof.

EXAMPLES

Providing Examples and Comparative Examples, the embodiment described above will be more specifically illustrated.

Preparation of Polishing Compositions

The polishing compositions of Examples 1 to 5 and Comparative Examples 1 to 5 were prepared by combining colloidal silica having an average primary particle size of 35 nm as abrasive grains, water-soluble polymers, ammonia as the basic compound, and deionized water. As the water-soluble polymers PVA-PVP graft copolymers (Examples 1 to 5 and Comparative Example 5), PVA homopolymer (Comparative Example 1), PVP homopolymer (Comparative Example 2), a mixture of PVA homopolymer and PVP homopolymer in an equal quantity (Comparative Example 3), and a partially cationized PVA homopolymer (Comparative Example 4) were used. In addition hydrochloric acid was added such that the pH was adjusted to below 7 in Comparative Example 5. The common composition of the polishing compositions in each Example and Comparative Example is shown in Table 1.

Measurement of the Characteristic Value P for Each Monomer Unit Composing the Copolymers The PVA-PVP graft copolymers used in each of Examples consisted of the monomer unit derived from vinyl alcohol and that derived from N-vinyl-2-pyrroridone, as shown in Table 3. For both of these monomer units, the wettability coefficients S1 were obtained through the standard test A and also the adsorption coefficients were obtained through the standard test B. The characteristic values P were calculated from the obtained wettability coefficients S1 and adsorption coefficients S2. These results are shown in the columns "First monomer unit" and "Second monomer unit" in Table 3.

The specific methods for determining the wettability coefficients S1 and adsorption coefficients S2 by the standard tests A and B, and the specific method for calculating the characteristic values P are common for both of the monomer units. Therefore, the methods will be described only for the monomer unit derived from vinyl alcohol.

[Standard Test A]

(a1) A homopolymer consisting of only a monomer unit derived from vinyl alcohol (PVA homopolymer) having an average degree of polymerization of 1000 was provided as a test polymer.

(a2) A square silicon chip (side length of 32 mm, conduction type of P type, crystal orientation of <100>, and resistivity of 0.1 Ω·cm or more and 100 Ω·cm or less) was immersed in 3% hydrofluoric acid solution for 30 seconds so that the oxide film on the silicon chip surface was removed.

(a3) The silicon chip, in a vertically upright state, was immersed in a 0.02% aqueous solution of the test polymer for 30 seconds.

(a4) The silicon chip was removed from the aqueous solution of the test polymer, and then the silicon chip was arranged such that one diagonal line thereof was oriented in the vertical direction. After 5 second standing, the shortest distance X [mm] from the highest point of the silicon chip to the liquid surface remaining on the silicon chip surface was measured. As a result, the shortest distance X was 10 mm.

(a5) The wettability coefficient S1 was calculated from the measured shortest distance X (10 mm) based on the expression below and the wettability coefficient S1 was 78.

Wettability coefficient $S1=\{$(the length of the diagonal line of the silicon chip [mm])−(the shortest distance $X$ [mm])$\}$/(the length of the diagonal line of the silicon chip [mm])×100=(45−10)/45× 100=78

[Standard Test B]

(b1) A homopolymer consisting of only a monomer unit derived from vinyl alcohol (PVA homopolymer) having an average degree of polymerization of 1000 was provided as a test polymer.

(b2) An aqueous solution containing 10% by mass of colloidal silica having an average primary particle size of 35 nm measured by the BET method (PL-3, produced by Fuso Chemical Co., Ltd.), 0.2% by mass of ammonia, and 0.02% by mass of the test polymer was prepared. The aqueous solution was allowed to stand for 12 hours so that the test polymer was adsorbed onto the colloidal silica.

(b3) Water was added to the aqueous solution to dilute the solution twentyfold in terms of volume. The diluted aqueous solution was subjected to centrifugation (20000 rpm, 30 min.) to precipitate the colloidal silica and the test polymer adsorbed onto the colloidal silica.

(b4) The supernatant liquid of the aqueous solution after centrifugation treatment was collected and the concentration Y of the test polymer in the supernatant liquid was measured. Specifically a calibration curve indicative of the relationship between the concentration of the test polymer and the total organic carbon content had been made in advance using standard samples containing the test polymer of known concentrations, and then the measured value for the total organic carbon content was compared with the calibration curve to determine the concentration Y of the test polymer. As a result, the concentration Y of the test polymer in the supernatant liquid was 0.001% by mass.

(b5) The adsorption coefficient S2 was calculated from the measured concentration Y of the test polymer (0.001% by mass) based on the expression below and the adsorption coefficient S2 was 0.

Adsorption coefficient $S2=\{0.02-(\text{concentration } Y)\times(\text{dilution rate})\}/0.02\times100=\{0.02-0.001\times20\}/0.02\times100=0$

[Calculation of Characteristic Value P]

As the results of the standard tests A and B, the wettability coefficient S1 of the monomer unit derived from vinyl alcohol was 78 and the adsorption coefficient S2 was 0. Accordingly the characteristic value P, which is the difference obtained by subtracting the adsorption coefficient S2 from the wettability coefficient S1, is 78 (78=78−0). That is, the monomer unit derived from vinyl alcohol had a characteristic value P of 50 or more and 100 or less, thereby being the first monomer unit.

Polishing Tests

Next, a surface of a silicon substrate after preliminary polishing was polished using each of the polishing compositions of the Examples and the Comparative Examples under the conditions described in Table 2. The silicon substrate used was of a diameter of 300 mm, conduction type of P type, crystal orientation of <100>, and resistivity of 0.1 Ω·cm or more and 100 Ω·cm or less which had been preliminarily polished using polishing slurry (trade name GLANZOX 1103) produced by Fujimi Incorporated. The wettability and the haze level of the polished surface were evaluated for each silicon substrate after the polishing.

Wettability

The wettability of the polished surface of each silicon substrate after the polishing was evaluated in A-E. The results are shown in the columns "Wettability" in Tables 3 and 4. The evaluation standards for the wettability are as follows:

A: the case where the distance of the water-repellent part from the substrate edge in the polished surface was less than 10 mm;

B: the case where the distance of the water-repellent part from the substrate edge in the polished surface was 10 mm or more and less than 15 mm;

C: the case where the distance of the water-repellent part from the substrate edge in the polished surface was 15 mm or more and less than 20 mm;

D: the case where the distance of the water-repellent part from the substrate edge in the polished surface was 20 mm or more and less than 25 mm; and E: the case where the distance of the water-repellent part from the substrate edge in the polished surface was 25 mm or more.

Haze Levels

The haze level of the polished surface of the each silicon substrate after the polishing was evaluated in A-E based on the measured value obtained from the measurement of the polished surface thereof using wafer inspection equipment Surfscan SP2 produced by KLA-Tencor Corporation in DWO mode of the equipment. The results are shown in the columns "Haze level" in Tables 3 and 4. The evaluation standards for the haze level are as follows:

A: the case where the measured value described above was less than 0.13 ppm;

B: the case where the measured value described above was 0.13 ppm or more and less than 0.14 ppm;

C: the case where the measured value described above was 0.14 ppm or more and less than 0.15 ppm;

D: the case where the measured value described above was 0.15 ppm or more and less than 0.16 ppm; and E: the case where the measured value described above was 0.16 ppm or more.

TABLE 1

| Common composition | Content [% by mass] |
|---|---|
| Abrasive grains | 0.50 |
| Water-soluble polymer | 0.01 |
| Ammonia | 0.01 |

TABLE 2

| | |
|---|---|
| Polishing machine | Sheet fed polishing machine (PNX-332B, Okamoto Machine Tool Works, Ltd.) |
| Polishing load | 15 kPa |
| Revolution of surface plate | 30 rpm |
| Revolution of head | 30 rpm |
| Polishing time | 4 minutes |
| Temperature of polishing composition | 20° C. |
| Feed rate of polishing composition | 0.5 L/min (pouring onto the substrate) |

TABLE 3

| | Water-soluble polymer | First monomer unit | Second monomer unit | pH | Wettability | Haze level |
|---|---|---|---|---|---|---|
| Ex. 1 | PVA-PVP graft copolymer Main chain (PVA) MW: 75000 Side chain (PVP) MW per chain: 250000 | 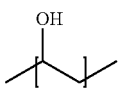 (S1:78 S2:0 P:78) | 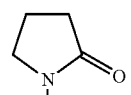 (S1:96 S2:92 P:4) | 10.2 | A | A |

TABLE 3-continued

| Water-soluble polymer | First monomer unit | Second monomer unit | pH | Wetta-bility | Haze level |
|---|---|---|---|---|---|
| Ex. 2 PVA-PVP graft copolymer<br>Main chain (PVA) MW: 9000<br>Side chain (PVP) MW per chain: 250000 | | | 10.2 | C | A |
| Ex. 3 PVA-PVP graft copolymer<br>Main chain (PVA) MW: 22000<br>Side chain (PVP) MW per chain: 250000 | | | 10.2 | B | A |
| Ex. 4 PVA-PVP graft copolymer<br>Main chain (PVA) MW: 75000<br>Side chain (PVP) MW per chain: 100000 | | | 10.2 | A | A |
| Ex. 5 PVA-PVP graft copolymer<br>Main chain (PVA) MW: 22000<br>Side chain (PVP) MW per chain: 30000 | | | 10.2 | B | A |

TABLE 4

| | Water-soluble polymer | pH | Wetta-bility | Haze level |
|---|---|---|---|---|
| Com. Ex. 1 | PVA homopolymer (MW: 27000) | 10.2 | D | D |
| Com. Ex. 2 | PVP homopolymer (MW: 250000) | 10.2 | A | E |
| Com. Ex. 3 | PVA homopolymer (MW: 27000) + PVP homopolymer (MW: 250000) | 10.2 | D | A |
| Com. Ex. 4 | Partially cationized PVA homopolymer (MW: 27000) | 10.2 | E | E |
| Com. Ex. 5 | PVA-PVP graft copolymer<br>Main chain (PVA) MW: 75000<br>Side chain (PVP) MW per chain: 250000 | 6 | B | E |

As shown in Table 3, excellent results were obtained for both evaluation of the wettability and haze level in Examples 1 to 5. On the other hand, at least one of the wettability and haze level was insufficient in Comparative Examples 1 to 5 as shown in Table 4.

The invention claimed is:

1. A method of polishing a substrate consisting of silicon, the method comprising:
   providing a substrate consisting of silicon; and
   polishing the substrate with a polishing composition having a pH of 7 or more the polishing composition comprising abrasive grains and a water-soluble polymer,
   wherein the water-soluble polymer is a copolymer composed of a first monomer unit having a characteristic value P of 50 or more and 100 or less and a second monomer unit having a characteristic value P of −100 or more and less than 50, wherein the characteristic value P is a difference obtained by subtracting an adsorption coefficient S2 for the abrasive grains obtained through a standard test B described below from a wettability coefficient S1 for the silicon substrate obtained through a standard test A described below:

[Standard test A]
(a1) a homopolymer consisting of only a monomer unit to be tested having an average degree of polymerization of 800 or more and 1200 or less is provided as a test polymer;
(a2) a square silicon chip (side length of 32 mm, conduction type of P type, crystal orientation of <100>, and resistivity of 0.1 Ω·cm or more and 100 Ω·cm or less is immersed in a hydrofluoric acid solution so that an oxide film on a silicon chip surface is removed;
(a3) the silicon chip, in a vertically upright state, is immersed in a 0.02% aqueous solution of the test polymer for 30 seconds;
(a4) the silicon chip is removed from the aqueous solution of the test polymer, and then the silicon chip is arranged such that one diagonal line thereof is oriented in the vertical direction; and after 5-second standing, the shortest distance X [mm] from the highest point of the silicon chip to the liquid surface remaining on the silicon chip surface is measured;
(a5) the wettability coefficient S1 of the monomer unit composing the test polymer is calculated from the measured shortest distance X based on the expression below:

Wettability coefficient $S1=\{(\text{the length of the diagonal line of the silicon chip [mm]})-(\text{the shortest distance } X \text{ [mm]})\}/(\text{the length of the diagonal line of the silicon chip [mm]})\times 100$

[Standard test B]
(b1) a homopolymer consisting of only a monomer unit to be tested having an average degree of polymerization of 800 or more and 1200 or less is provided as a test polymer;
(b2) an aqueous solution containing 10% by mass of colloidal silica having an average primary particle size of 35 nm, 0.2% by mass of ammonia, and 0.02% by mass of the test polymer is prepared; and the aqueous solution is allowed to stand for 12 hours so that the test polymer is adsorbed onto the colloidal silica;
(b3) water is added to the aqueous solution to dilute the solution in a predetermined dilution rate in terms of volume; and the diluted aqueous solution is centrifuged to precipitate the colloidal silica and the test polymer adsorbed onto the colloidal silica;
(b4) the concentration Y [% by mass] of the test polymer in a supernatant liquid of the aqueous solution after centrifugation treatment is measured;
(b5) the adsorption coefficient S2 of the monomer unit composing the test polymer is calculated from the measured concentration Y of the test polymer based on the expression below:

Adsorption coefficient $S2=\{0.02-(\text{the concentration } Y)\times(\text{the dilution rate})\}/0.02\times 100$.

2. The method according to claim 1, wherein the copolymer is a block copolymer or a graft copolymer.

3. The method according to claim 1, wherein at least one monomer unit composing the copolymer is a monomer unit derived from an ethylenically unsaturated compound.

4. The method according to claim 1, wherein the first monomer unit has at least one structure selected from an ethylene oxide group, a carboxy group, a sulfo group, an amino group, a hydroxyl group, an amide group, an imide group, a nitrile group, an ether group, an ester group, and salts thereof.

5. The method according to claim 1, wherein the second monomer unit has a heterocyclic ring.

6. The method according to claim 5, wherein the heterocyclicring is a lactam group.

* * * * *